(12) United States Patent
Kodama

(10) Patent No.: US 9,851,781 B2
(45) Date of Patent: Dec. 26, 2017

(54) SYSTEM, CONTROL METHOD OF SYSTEM, AND STORAGE MEDIUM

(71) Applicant: FUJITSU LIMITED, Kawasaki-shi, Kanagawa (JP)

(72) Inventor: Hiroyoshi Kodama, Isehara (JP)

(73) Assignee: FUJITSU LIMITED, Kawasaki (JP)

(*) Notice: Subject to any disclaimer, the term of this patent is extended or adjusted under 35 U.S.C. 154(b) by 637 days.

(21) Appl. No.: 14/550,009

(22) Filed: Nov. 21, 2014

(65) Prior Publication Data
US 2015/0241888 A1 Aug. 27, 2015

(30) Foreign Application Priority Data
Feb. 27, 2014 (JP) ................. 2014-036979

(51) Int. Cl.
*H02B 1/56* (2006.01)
*H05K 7/20* (2006.01)
*G06F 1/32* (2006.01)
*G05D 23/19* (2006.01)
*G06F 1/20* (2006.01)

(52) U.S. Cl.
CPC ....... *G06F 1/3296* (2013.01); *G05D 23/1934* (2013.01); *G06F 1/206* (2013.01); *H05K 7/20836* (2013.01); *Y02B 60/1275* (2013.01)

(58) Field of Classification Search
None
See application file for complete search history.

(56) References Cited

U.S. PATENT DOCUMENTS

| 8,961,279 B2* | 2/2015 | Takagi ................. F24F 11/0079 361/695 |
| 2008/0288193 A1* | 11/2008 | Claassen ............ H05K 7/20836 702/61 |

(Continued)

FOREIGN PATENT DOCUMENTS

| JP | 2004-286365 | 10/2004 |
| JP | 2010-108324 | 5/2010 |
| JP | 2013-204932 | 10/2013 |

OTHER PUBLICATIONS

Japanese Office Action dated Aug. 22, 2017 from Japanese Patent Application No. 2014-036979, 9 pages.

*Primary Examiner* — Ronald Hartman, Jr.
(74) *Attorney, Agent, or Firm* — Staas & Halsey LLP

(57) ABSTRACT

A control method includes supplying, by a second cooling apparatus, air at a first airflow rate to a plurality of computers each of which provides a first cooling apparatus; acquiring information on power consumption of the plurality of first cooling apparatuses and power consumption of the second cooling apparatus; supplying, by the second cooling apparatus, air at a second airflow rate, having a value obtained by changing the first airflow rate by a predetermined amount to the plurality of computers; acquiring information on the power consumption of the plurality of first cooling apparatuses and the power consumption of the second cooling apparatus; and changing an airflow rate of the second cooling apparatus by the predetermined amount, based on a comparison result between a changed amount of the power consumption of the plurality of first cooling apparatuses and a changed amount of the power consumption of the second cooling apparatus.

14 Claims, 12 Drawing Sheets

(56) References Cited

U.S. PATENT DOCUMENTS

| | | | | |
|---|---|---|---|---|
| 2010/0032142 A1* | 2/2010 | Copeland | ........... | G05D 23/1925 |
| | | | | 165/104.33 |
| 2011/0016893 A1* | 1/2011 | Dawes | ................. | F25B 49/02 |
| | | | | 62/89 |
| 2011/0132579 A1* | 6/2011 | Best | ................... | H05K 7/20763 |
| | | | | 165/104.31 |
| 2011/0306287 A1* | 12/2011 | Takagi | ................. | F24F 11/0079 |
| | | | | 454/184 |
| 2012/0241140 A1* | 9/2012 | MacDonald | ........... | G06F 1/206 |
| | | | | 165/278 |
| 2013/0083481 A1* | 4/2013 | Goto | ................. | H05K 7/20209 |
| | | | | 361/695 |
| 2013/0098599 A1* | 4/2013 | Busch | ................ | H05K 7/20209 |
| | | | | 165/294 |
| 2013/0103210 A1* | 4/2013 | Brey | ..................... | G05B 13/02 |
| | | | | 700/282 |
| 2013/0133350 A1* | 5/2013 | Reytblat | ............ | H05K 7/20718 |
| | | | | 62/259.2 |
| 2014/0060799 A1* | 3/2014 | Eckberg | ............. | G05D 23/1932 |
| | | | | 165/287 |
| 2014/0181539 A1* | 6/2014 | Lin | ........................ | G06F 1/206 |
| | | | | 713/300 |
| 2014/0334091 A1* | 11/2014 | Damaraju | ............. | F04D 27/004 |
| | | | | 361/679.47 |
| 2015/0192936 A1* | 7/2015 | Kelly | .................. | H05K 7/1498 |
| | | | | 700/300 |
| 2015/0363515 A1* | 12/2015 | Singh | ................. | G06F 17/5004 |
| | | | | 703/1 |

\* cited by examiner

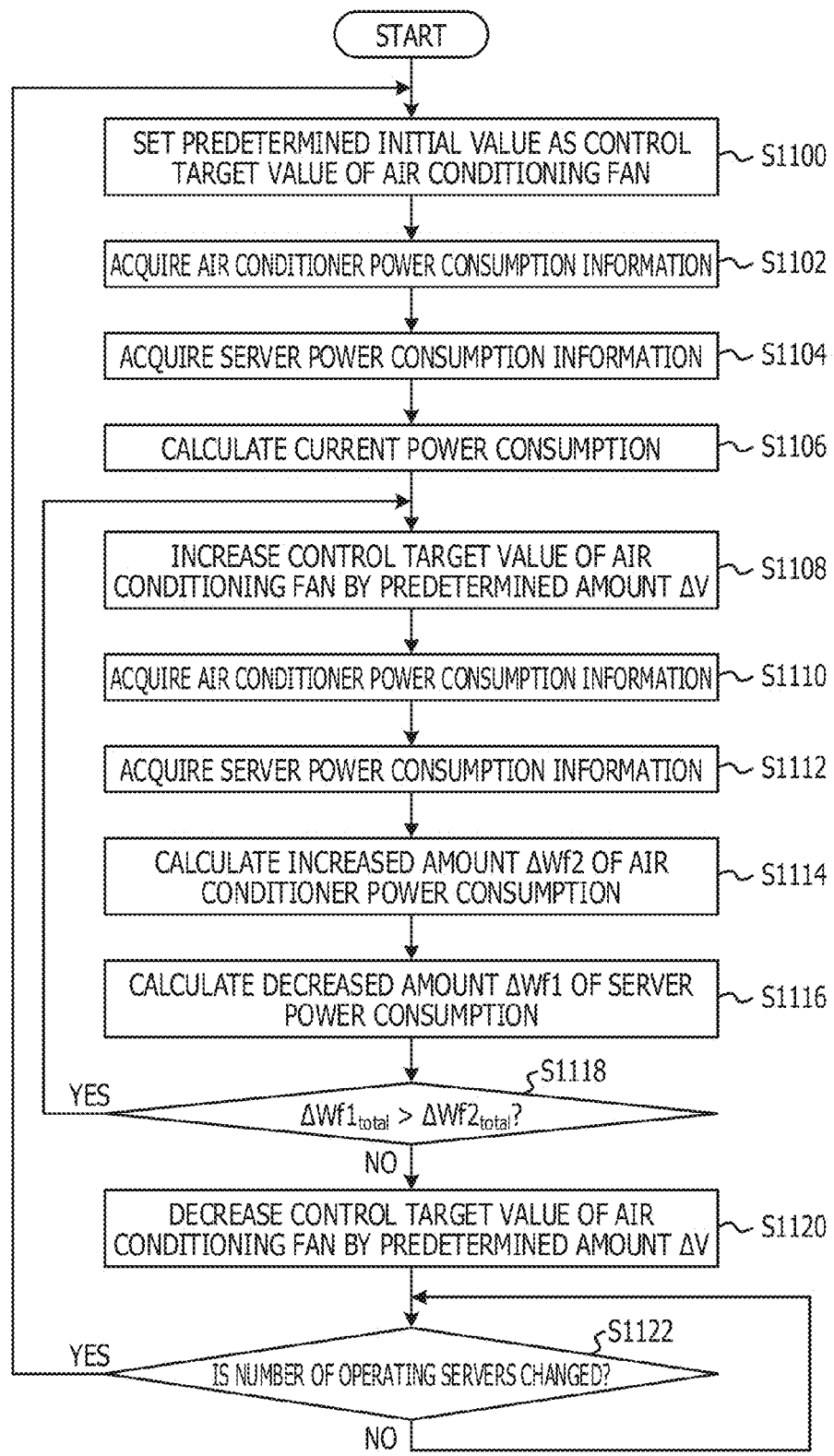

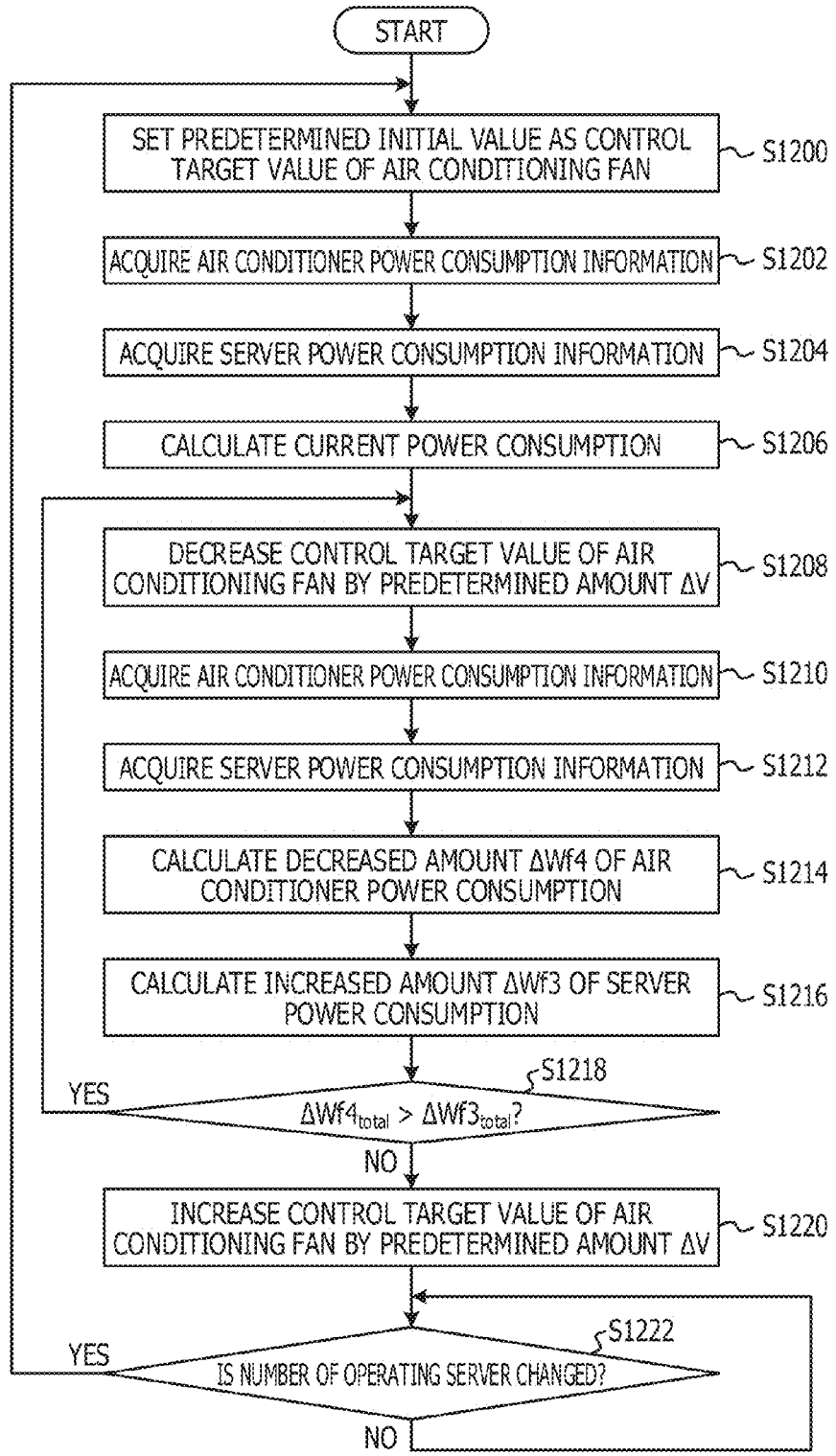

SYSTEM, CONTROL METHOD OF SYSTEM, AND STORAGE MEDIUM

CROSS-REFERENCE TO RELATED APPLICATION

This application is based upon and claims the benefit of priority of the prior Japanese Patent Application No. 2014-036979, filed on Feb. 27, 2014, the entire contents of which are incorporated herein by reference.

FIELD

The embodiments discussed herein are related to a system, a control method of the system, and a storage medium.

BACKGROUND

Conventionally, there has been known an air-conditioning system including an electronic equipment housing rack, a main air conditioner that is installed in a room where the rack is installed and controls the temperature in the room, and a control circuit that is provided in the rack and controls power supply to an exhaust fan (for example, see Japanese Laid-open Patent Publication No. 2004-286365). The control circuit sends operation information on the exhaust fan or information on the power consumption of the electronic equipment housed in the rack to the main air conditioner. Further, the main air conditioner controls output based on the received information.

In a data center, it is preferable to appropriately cool information processing apparatus by built-in fans in the information processing apparatus and a cooling apparatus. Further, it is preferable to reduce the total power consumption (electric power consumption in the data center) which is the sum of the power consumption of the information processing apparatus and the power consumption of the cooling apparatus.

SUMMARY

According to an aspect of the invention, a control method of a system including a plurality of computers each of which provides a first cooling apparatus, and a second cooling apparatus that cools the plurality of computers by supplying air thereto, the control method includes supplying, by the second cooling apparatus, air at a first airflow rate to the plurality of computers; acquiring first information on power consumption of the plurality of first cooling apparatuses in the plurality of computers and power consumption of the second cooling apparatus under the supply of the air at the first airflow rate; supplying, by the second cooling apparatus, air at a second airflow rate to the plurality of computers after the first information is acquired, the second airflow rate having a value obtained by changing the first airflow rate by a predetermined amount; acquiring second information on the power consumption of the plurality of first cooling apparatuses in the plurality of computers and the power consumption of the second cooling apparatus under the supply of the air at the second airflow rate; and changing the airflow rate of the second cooling apparatus by the predetermined amount, based on a comparison result between a changed amount of the power consumption of the plurality of first cooling apparatuses in the plurality of computers and a changed amount in the power consumption of the second cooling apparatus under the condition that the airflow rate is changed from the first airflow rate to the second airflow rate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 is a flowchart illustrating an example of processing executed by a management manager; and FIG. 12 is a flowchart illustrating another example of processing executed by the management manager.

DESCRIPTION OF EMBODIMENTS

Hereinafter, embodiments will be explained in detail with reference to the attached drawings.

Figure 1:
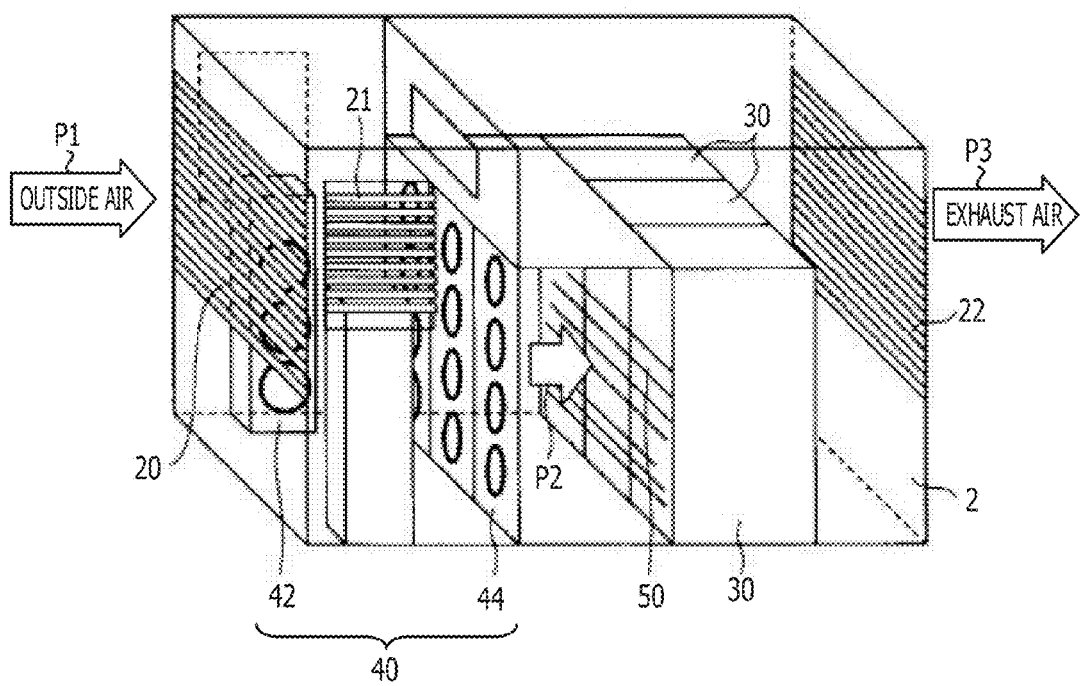
FIG. 1 is a perspective view illustrating an example of a container-type data center.

FIG. 1 is a perspective view schematically illustrating an example of a container-type data center. A container-type data center 1 is a system that includes a container 2. In the container 2, formed are an air-intake port 20 of outside air and an air-exhaust port 22. The positions of the air-intake port 20 and the air-exhaust port 22 may be flexibly determined. In the example illustrated in FIG. 1, the air-intake port 20 and the air-exhaust port 22 are formed on opposing side surfaces in the container 2. Another air-intake port 21 may be formed in the container 2.

Racks 30 and a cooling apparatus 40 are disposed in the container 2. Each of the racks 30 houses therein servers 50 (an example of information processing apparatus). The racks 30 are typically provided in plurality with respect to one container 2. The servers 50 are provided in plurality with respect to one rack 30.

The cooling apparatus 40 includes a cooler 42 that creates cold air, and a container fan 44 (an example of a cooling fan). The cooler 42 may employ any creation principle for obtaining cold air, and may employ an evaporation method, for example. The cooler 42 and the container fan 44 may be provided in any numbers. The cooling apparatus 40 is disposed closer to the air-intake port 20 than the racks 30 in the container 2, for example, as illustrated in FIG. 1. The container fan 44 introduces outside air through the air-intake port 20 in the container 2 when the cooling apparatus 40 is operated, as illustrated by an arrow P1 in FIG. 1. The outside air introduced in this manner is cooled by the cooler 42. The outside air cooled by the cooler 42 flows to the racks 30 due to an effect of the container fan 44, as illustrated by an arrow P2 in FIG. 1. With this, all the servers 50 housed in the rack 30s are cooled. The outside air used for the cooling of the servers 50 is discharged via the air-exhaust port 22 to the outside of the container 2 due to the effect of the container fan 44, as illustrated by an arrow P3 in FIG. 1. This implements the cooling of the servers 50 housed in the racks 30. The airflow rate as a whole created by the cooling apparatus 40 is determined depending on the rotational speed (drive duty ratio) of the container fan 44.

The container-type data center 1 illustrated in FIG. 1 is merely an example. The positions and the like of the cooling apparatus 40 and the racks 30 may be flexibly determined.

Figure 2:
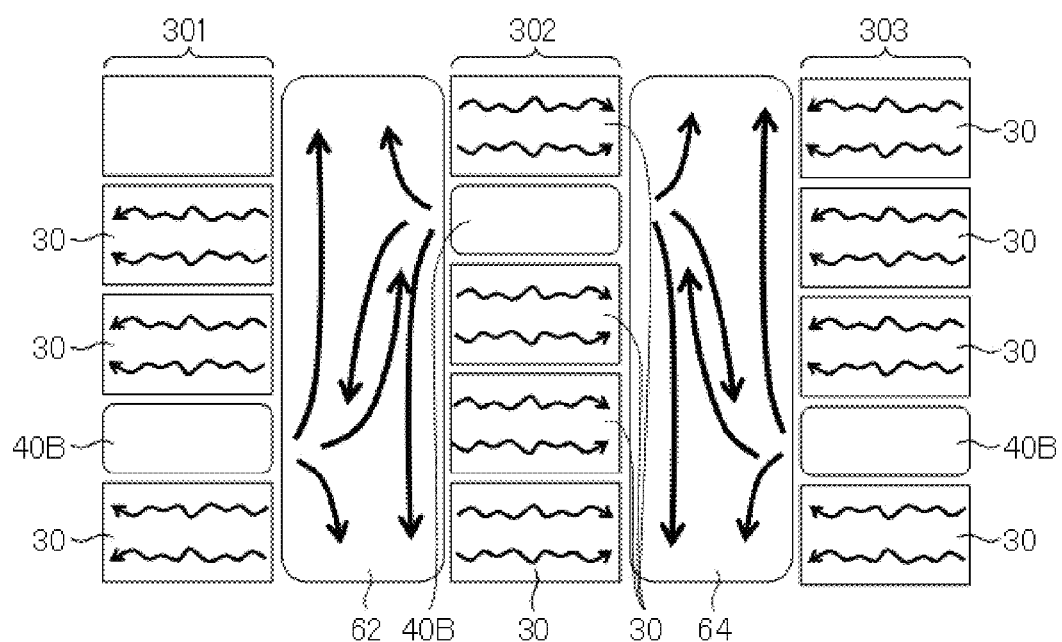
FIG. 2 is a top view illustrating an example of a modular-type data center.

FIG. 2 is a top view illustrating an example of a modular-type data center. FIG. 2 schematically illustrates the flow of air in the modular-type data center by arrows.

A modular-type data center 1A is a system that includes the racks 30, and a cooling apparatus 40B. Each of the racks 30 similarly houses therein servers (not illustrated).

Figure 4:
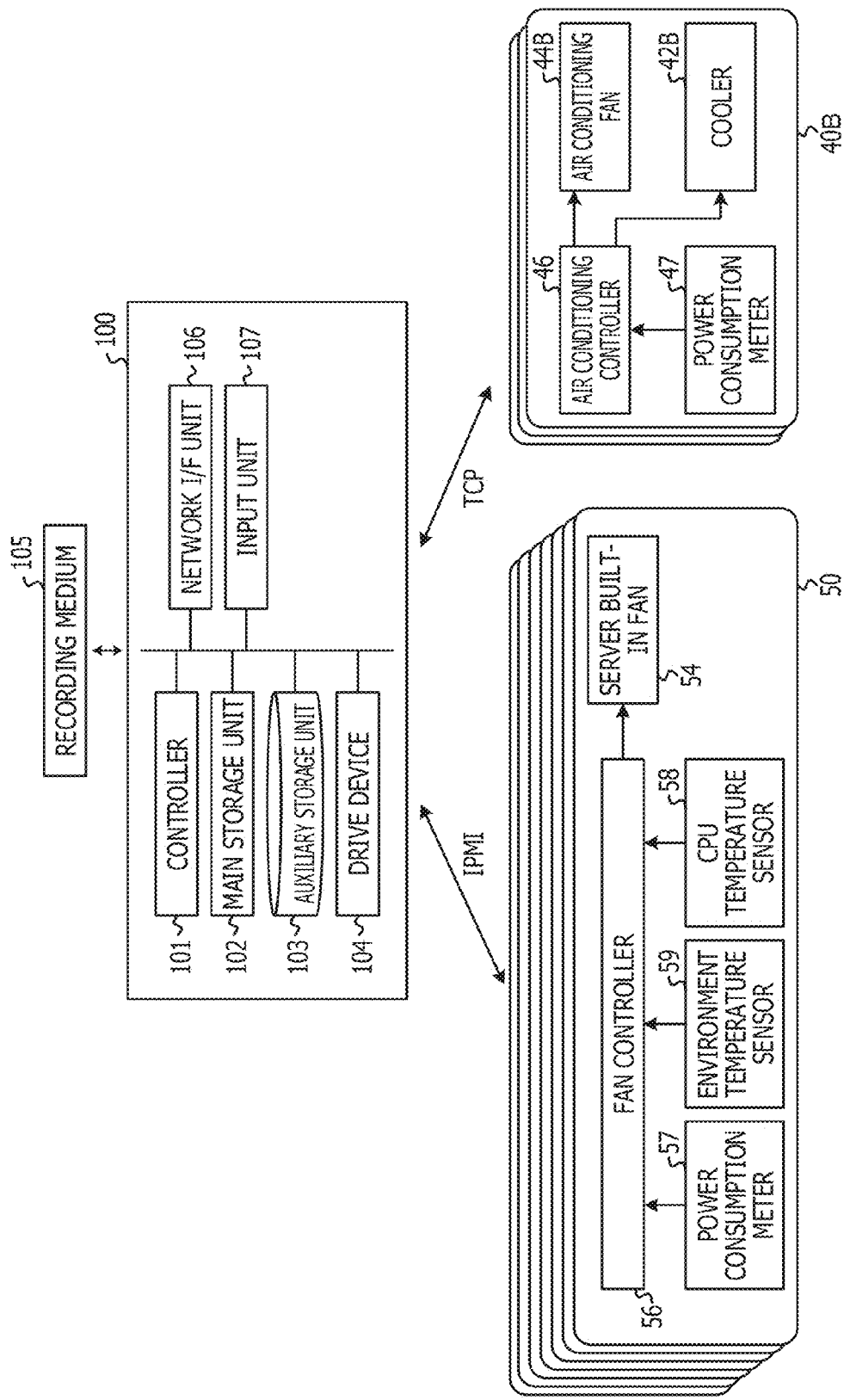
FIG. 4 is a diagram illustrating an example of a control system of the data center.

The cooling apparatus 40B is an air conditioner provided with a cooler 42B (see FIG. 4), and an air conditioning fan 44B (an example of a cooling fan, see FIG. 4). The cooling apparatus 40B may send, similar to the cooling apparatus 40, air containing cold air to the racks 30. For example, the cooler 42B includes a compressor for creating cold air. In the example illustrated in FIG. 2, one cooling apparatus 40B is set with respect to four racks 30 in the modular-type data center 1A of eight-rack blocks. Note that, the numbers of the cooling apparatuses 40B and the racks 30 and the arrangement forms thereof may be flexibly determined.

The modular-type data center 1A alternately includes a cold aisle 62 and a hot aisle 64 between columns of the racks 30. In the example illustrated in FIG. 2, the cold aisle 62 is formed between a first rack column 301 and a second rack column 302. The hot aisle 64 is formed between the second rack column 302 and a third rack column 303. As schematically illustrated by the arrows in FIG. 2, to the cold aisle 62, sent are the cold air from the cooling apparatus 40B in the first rack column 301 and the cold air from the cooling apparatus 40B in the second rack column 302. The air in the cold aisle 62 is used for cooling of the servers in the first rack column 301 and the second rack column 302. As schematically illustrated by the arrows in FIG. 2, to the hot aisle 64, sent are the air used for the cooling of the servers in the second rack column 302 and the air used for the cooling of the servers in the third rack column 303. The air in the hot aisle 64 may be discharged to the outside of the modular-type data center 1A.

Figure 3:
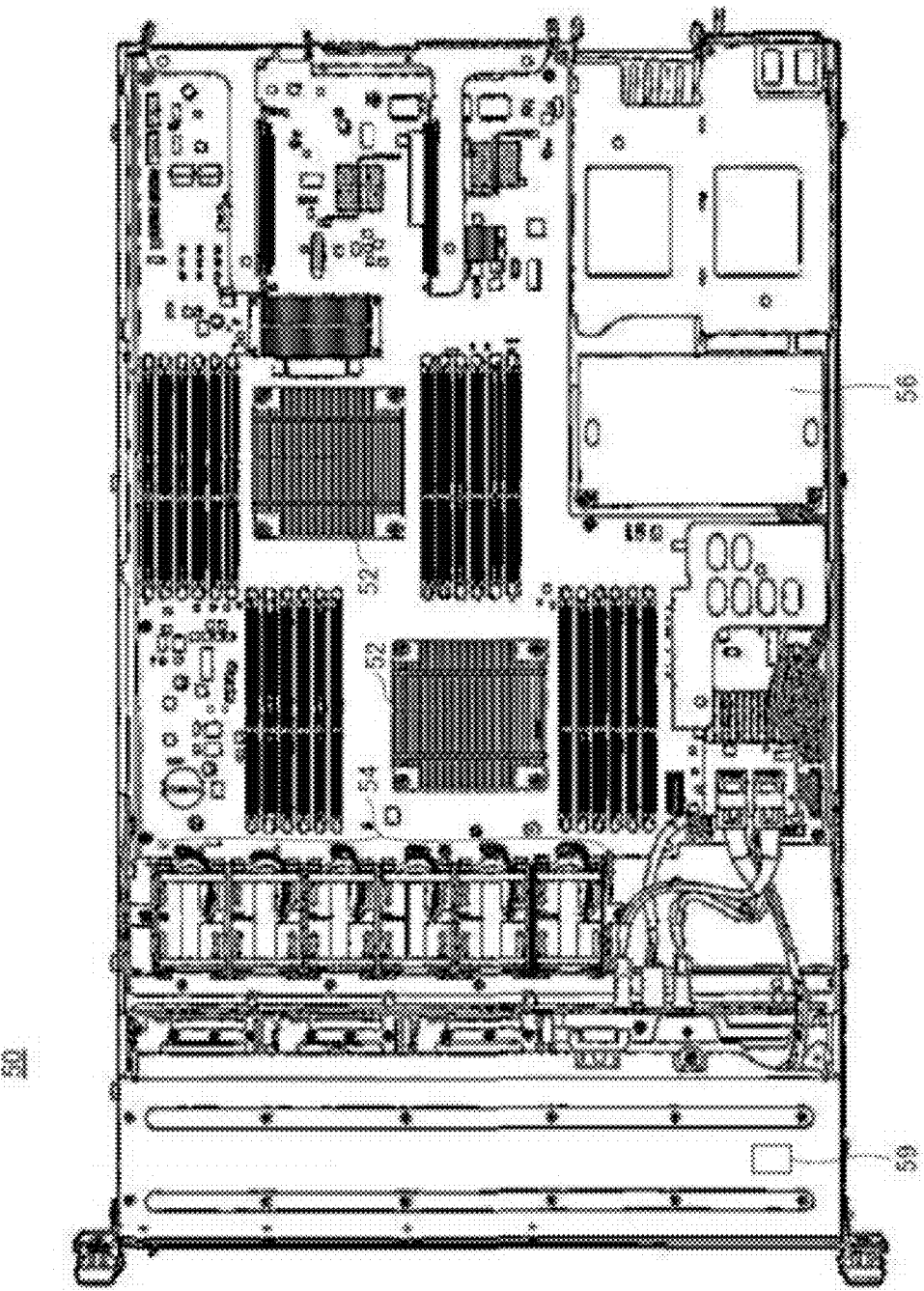
FIG. 3 is a top view illustrating an example of a server.

FIG. 3 is a top view illustrating an example of the server 50. In FIG. 3, the server 50 is illustrated in a state where a cover is open for understanding the inner structure. Although one of the servers 50 is representatively illustrated in FIG. 3, the other servers 50 may be the same as the one server 50.

The server 50 includes a CPU 52, a server built-in fan 54, a power distribution unit (PDU) 56, an environment temperature sensor 59.

The CPU 52 includes therein a CPU temperature sensor 58 (see FIG. 4) that measures the temperature of the CPU 52 (hereinafter, referred to as "CPU temperature"). In the example illustrated in FIG. 3, although two CPUs 52 are mounted with respect to one server 50, the number of the CPUs 52 may be flexibly determined. The server built-in fan 54 is provided to cool electronic components (for example, the CPU 52, the PDU 56, and the like) in the server 50.

The server built-in fans 54 are typically provided in plurality as illustrated in FIG. 3. The server built-in fan 54 may be provided at any position in the server 50.

The PDU 56 functions as a power supply for various kinds of loads (the CPU 52, the server built-in fan 54, and the like) in the server 50. The PDU 56 includes therein a power consumption meter 57 (see FIG. 4) that measures the electric power consumption of the server 50 (hereinafter, also referred to as "server power consumption"). The power consumption meter 57 may include a current sensor that detects the supply current and a voltage sensor that detects the supply voltage, from the PDU 56 to the various kinds of loads. In this case, the server power consumption is calculated based on the product of a current value and a voltage value.

The environment temperature sensor 59 measures the environment temperature. The environment temperature sensor 59 may be disposed at the air-intake side in the server 50.

FIG. 4 is a diagram illustrating an example of a control system of a data center. Hereinafter, as an example, the data center is assumed to be the modular-type data center 1A illustrated in FIG. 2. As for the container-type data center 1, in the following explanation, "the cooling apparatus 40B" may be regarded as "the cooling apparatus 40", "the cooler 42B" may be regarded as "the cooler 42", and "the air conditioning fan 44B" may be regarded as "the container fan 44".

The control system of the modular-type data center 1A includes, as illustrated in FIG. 4, a management manager 100 (an example a cooling apparatus controller), a fan controller 56 in the server 50, and an air conditioning controller 46 in the cooling apparatus 40B.

The fan controller 56 is provided in each of the multiple servers 50 in the modular-type data center 1A, as illustrated in FIG. 4. Note that, only one fan controller 56 may be provided common to the multiple servers 50 in the modular-type data center 1A.

The air conditioning controller 46 is provided in each of the multiple cooling apparatuses 40B in the modular-type data center 1A, as illustrated in FIG. 4. Note that, only one air conditioning controller 46 may be provided common to the multiple cooling apparatuses 40B in the modular-type data center 1A.

The management manager 100 may be implemented by a computer. The management manager 100 may be disposed inside the modular-type data center 1A, or may be disposed outside the modular-type data center 1A.

The management manager 100 includes, for example, as illustrated in FIG. 4, a controller 101, a main storage unit 102, an auxiliary storage unit 103, a drive device 104, a network I/F unit 106, and an input unit 107. The controller 101 is a calculation device that executes a program stored in the main storage unit 102 or the auxiliary storage unit 103. The controller 101 receives data from the input unit 107 or a storage device, calculates and processes the data, and then outputs the data to the storage device or the like. The main storage unit 102 is a read only memory (ROM), a random access memory (RAM), or the like. The main storage unit 102 is a storage device that stores or temporarily stores therein a program or the related data, such an OS as basic software or application software executed by the controller 101. The auxiliary storage unit 103 is, for example, a hard disk drive (HDD) or the like. The auxiliary storage unit 103 is a storage device that stores therein data related to the application software or the like. The drive device 104 reads out a program from a recording medium 105, for example, a flexible disk, and installs the program on the storage device. The recording medium 105 houses therein a predetermined program. The program housed in the recording medium 105 is installed on the management manager 100 via the drive device 104. The installed predetermined program is executable by the management manager 100. The network I/F unit 106 is an interface between the management manager 100 and peripheral devices (for example, the servers 50 and the like) that are coupled via a network constructed by data transmission lines such as wired and/or wireless channels and the like and have a communication function. The input unit 107 includes a key board provided with cursor keys, numeric input keys, various kinds of function keys, and the like, a mouse, a slide pad, and the like. In the example illustrated in FIG. 4, it is possible to implement the processing explained below and illustrated in FIG. 11 and the like by causing the management manager 100 to execute a program. Alternatively, it is also possible to implement the processing explained below and illustrated in FIG. 11 and the like by recording a program on the recording medium 105, and causing the management manager 100 to read the recording medium 105 on which the program is recorded. The recording medium 105 is, for example, a recording medium, such as a CD-ROM, a flexible disk, and a magneto-optical disk, that optically, electrically and magnetically records information thereon. The recording medium 105 is, for example, a semiconductor memory, such as a ROM or a flash memory, which electrically records information thereon. Various types of the recording medium may be used as the recording medium 105. A carrier wave is not included as the recording medium 105.

The management manager 100 is capable of communicating with all the servers 50 based on, for example, an intelligent platform management interface (IPMI). The management manager 100 acquires information (hereinafter, referred to as "server power consumption information") indicating the power consumption and the like, from the servers 50. The management manager 100 may notify all the servers 50 of a target CPU temperature.

The management manager 100 is capable of communicating with all the cooling apparatuses 40B based on, for example, a transmission control protocol (TCP). The management manager 100 acquires information (hereinafter, referred to as "air conditioner power consumption information") indicating the electric power consumption (hereinafter, also referred to as "air conditioner power consumption") and the like, from the cooling apparatuses 40B. Each of the cooling apparatuses 40B is provided with a power consumption meter 48. The power consumption meter 48 measures the power consumption consumed by the cooling apparatus 40B. The power consumption meter 48 may include a current sensor that detects the supply current and a voltage sensor that detects the supply voltage, to various kinds of loads (the air conditioning fan 44B, the cooler 42B, and the like) in the cooling apparatus 40B. In this case, the air conditioner power consumption is calculated based on the product of a current value and a voltage value. The management manager 100 notifies each of the cooling apparatuses 40B of a control target value of the air conditioning fan 44B. The control target value may be a target value of any physical amount related to the airflow rate, for example, may be a target airflow rate itself or may be a target value related to the rotational speed of fan, the duty ratio of fan, or the like.

Figure 5:
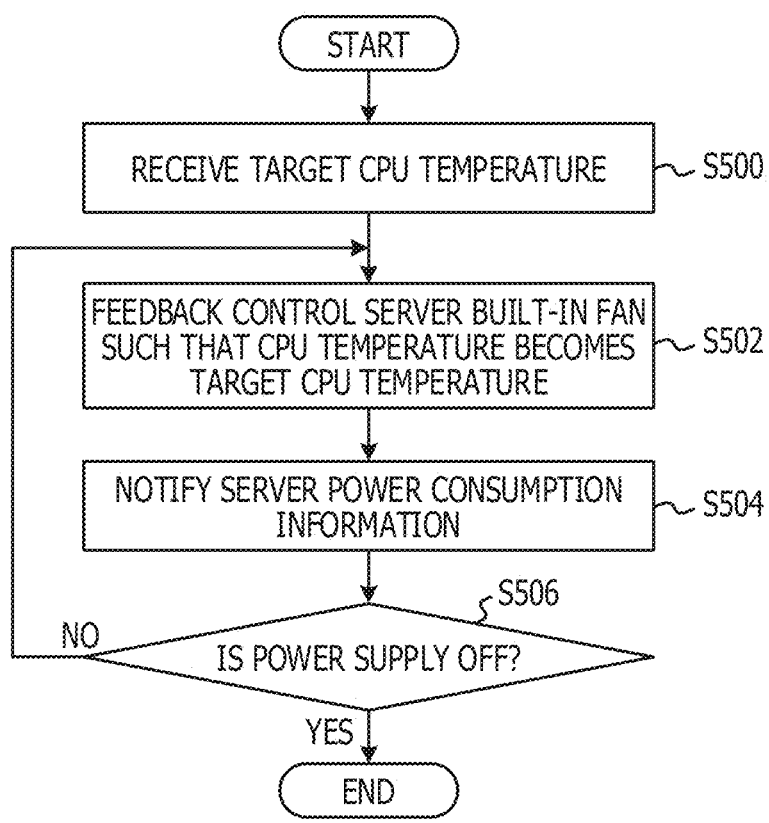
FIG. 5 is a flowchart illustrating an example of processing executed by a fan controller of the server.

FIG. 5 is a flowchart illustrating an example of processing executed by the fan controller 56 of the server 50. Herein, although processing of one of the servers 50 is explained, processing of the other servers 50 may be the same. The processing illustrated in FIG. 5 is started up, for example, when a power supply of the server 50 is turned on, and thereafter, is repeatedly executed for every predetermined cycle.

At S500, the fan controller 56 receives a target CPU temperature from the management manager 100. The target CPU temperature is set within the temperature range not more than an allowable upper limit value of the CPU temperature. An example of a setting method of the target CPU temperature is described later.

At S502, the fan controller 56 determines control target values of the respective server built-in fans 54 such that the target CPU temperature is implemented in accordance with a deviation between the CPU temperature based on the detection result by the CPU temperature sensor 58 and the target CPU temperature, and controls the server built-in fans 54. The control target values may be different from one another among the server built-in fans 54. The control target values are typically the same among the server built-in fans 54. In this manner, in accordance with the deviation between the CPU temperature and the target CPU temperature, the server built-in fans 54 are feedback-controlled. The mode of the feedback control may be flexibly determined. For example, proportional integral (PI) control may be used, or proportional integral derivative (PID) control, model control, and the like may be used. The control target value of the server built-in fan 54 may be a target value of any physical amount related to the airflow rate. For example, the control target value of the server built-in fan 54 may be a target airflow rate itself or may be a target value related to the rotational speed of fan, the duty ratio of fan, or the like.

At S502, the CPU temperature becomes lower than the target CPU temperature in some cases even if the minimum airflow rate of the server built-in fan 54 is set such as a case where the server 50 is in an idle state. In this case, the fan controller 56 determines a target value of the server built-in fan 54 such that the airflow rate of the server built-in fan 54 becomes a minimum value (for example 0).

At S504, the fan controller 56 creates server power consumption information indicating the current power consumption of the server 50 based on the detection result by the power consumption meter 57, and transmits the server power consumption information to the management manager 100. In the example illustrated in FIG. 5, the server power consumption information is transmitted to the management manager 100 for every predetermined cycle. However, the server power consumption information may be transmitted to the management manager 100 for multiple cycles, or may be transmitted to the management manager 100 in response to a request from the management manager 100.

All the processes at S502 and S504 are repeated for every predetermined cycle while the power supply of the server 50 is on state.

As for the process at S502 illustrated in FIG. 5, when the CPUs 52 in plurality are present in the server 50, the server built-in fans 54 may be controlled such that the CPU temperatures can become the target CPU temperature. The target CPU temperature may be different among the CPUs 52 (which is described later with reference to FIG. 6), or may be the same for all the CPUs 52. Alternatively, the server built-in fans 54 may be controlled such that the highest CPU temperature among the CPU temperatures can be decreased to the target CPU temperature.

Figure 6A:
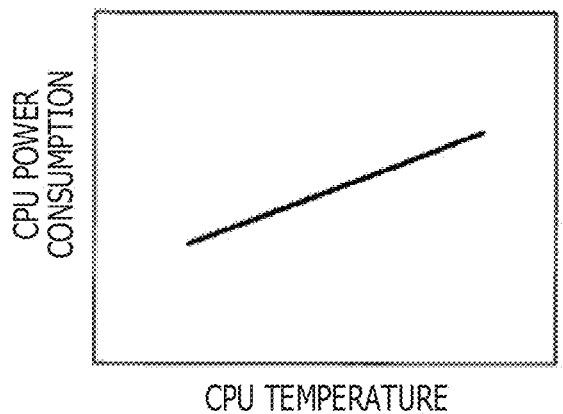
FIG. 6A, FIG. 6B, and FIG. 6C are explanation graphs of an example of a setting method of a target CPU temperature.
Figure 6B:
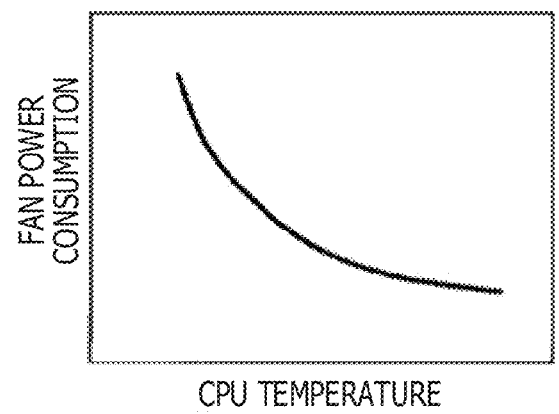
Figure 6C:
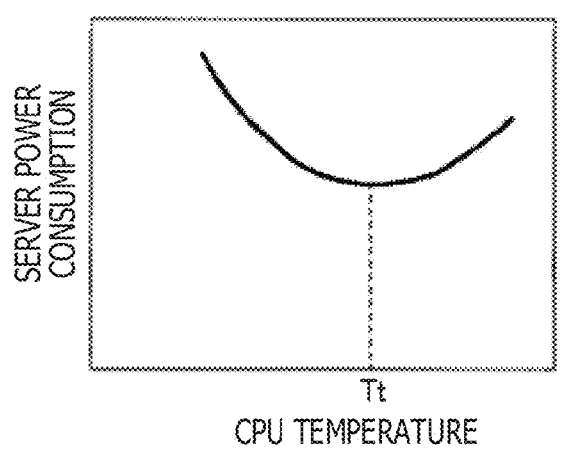

FIG. 6A, FIG. 6B, and FIG. 6C are explanation graphs of an example of a setting method of a target CPU temperature. FIG. 6A is a graph illustrating a relation between, in one server 50, the CPU temperature of the CPU 52 and the power consumption of the CPU 52 (CPU power consumption). FIG. 6B is a graph illustrating a relation between the CPU temperature and the power consumption of the server built-in fan 54 (fan power consumption). FIG. 6C is a graph illustrating a relation between the CPU temperature and the server power consumption.

The CPU 52 with a load applied thereto consumes the power. The high CPU temperature results in generation of a leak current in a circuit of the CPU 52. The relation between the leak current and the CPU temperature is determined in accordance with the circuit of the CPU 52 and the type of the CPU 52. The leak current is in proportion to the CPU temperature. Therefore, the CPU power consumption linearly increase with increase in the CPU temperature, as illustrated in FIG. 6A.

Meanwhile, as for the relation between the rotational speed of the server built-in fan 54 and the power consumption of the server built-in fan 54, the power consumption of the server built-in fan 54 exponentially increases as the rotational speed of the server built-in fan 54 increases. Decreasing the rotational speed of the server built-in fan 54 results in the less airflow rate for cooling the CPU 52. Accordingly, the CPU temperature is raised. Therefore, a relation of an exponential function as illustrated in FIG. 6B is obtained as the relation between the CPU temperature and the fan power consumption.

Herein, simply assuming that the server power consumption is a total of the CPU power consumption and the fan power consumption, a relation between the server power consumption and the CPU temperature as in FIG. 6C is obtained. In other words, a curve illustrated in FIG. 6C corresponds to the sum of a curve illustrated in FIG. 6A and a curve illustrated in FIG. 6B. As illustrated in FIG. 6C, a minimal value of the server power consumption is obtained at a specific CPU temperature Tt. Therefore, the CPU temperature Tt may be set to the target CPU temperature. With this, it is possible to implement such control that the minimum server power consumption is obtained on the server 50 basis.

The characteristics illustrated in FIG. 6 represent a characteristic of one CPU 52, and a characteristic of one server built-in fan 54. The server 50 may actually include the multiple CPUs 52 and the multiple server built-in fans 54 as described above. Therefore, in that case, the characteristics are added up to obtain the relation between the server power consumption and the CPU temperature as illustrated in FIG. 6C. Also in this case, a minimal value similarly appears, so that the CPU temperature at which the minimal value appears may be set as the target CPU temperature.

The CPU temperature Tt at which the abovementioned minimal value is obtained is known at a design stage by a test and the like. However, by considering that an individual difference of the servers 50 or a change in the characteristics with time, the CPU temperature Tt at which the minimal value appears may be derived for each of the servers 50, and/or may be updated on a periodic basis. For example, it is preferable to change the target CPU temperature with respect to the CPU temperature Tt obtained at the design stage within the range of ±3° C., compare the amounts of server power consumption among the target CPU temperatures, and use the target CPU temperature at which the server power consumption is minimum. In this case, the target CPU temperature may differ for each of the CPUs 52. The abovementioned CPU temperature Tt at which the minimal value is obtained differs in accordance with the environment temperature, so that the CPU temperature Tt may be derived in advance in accordance with the environment temperature. In this case, at S500 in FIG. 5, the target CPU temperature in accordance with the environment temperature is received from the management manager 100.

Figure 7A:
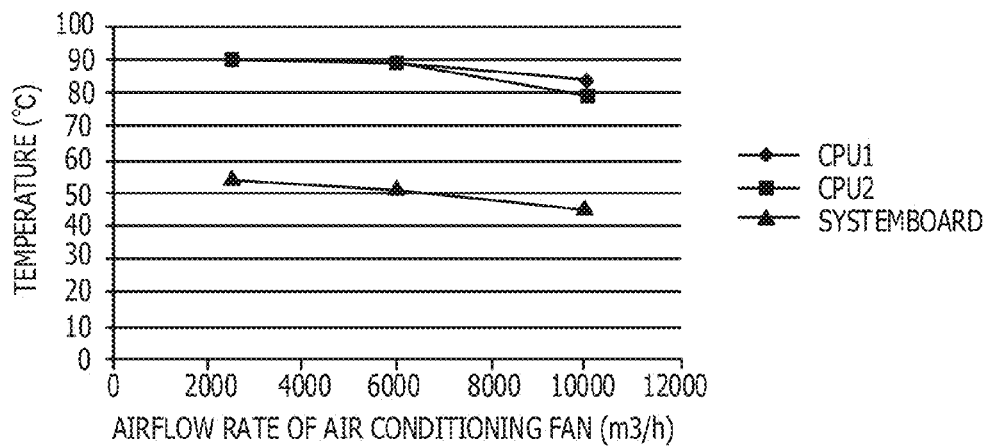
FIG. 7A, FIG. 7B, and FIG. 7C are graphs illustrating relations between the airflow rate of an air conditioning fan and the temperatures of components in the server (part 1)
Figure 7B:
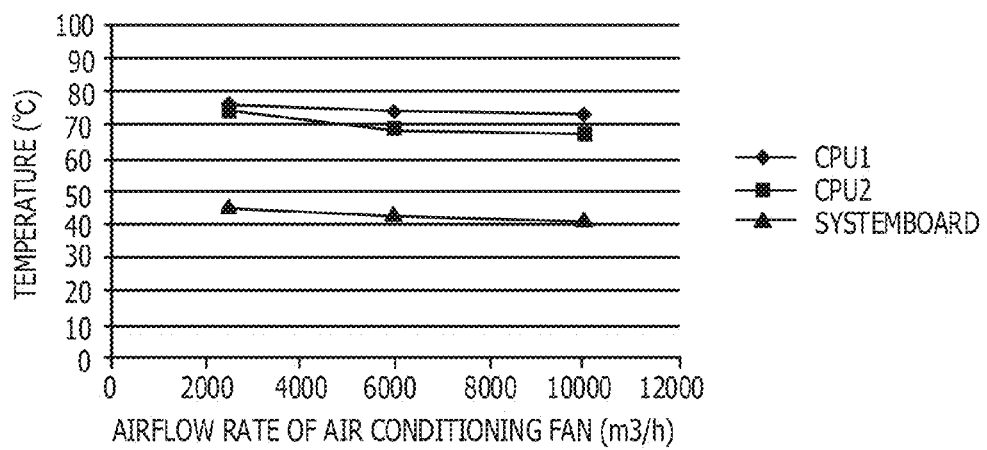
Figure 7C:
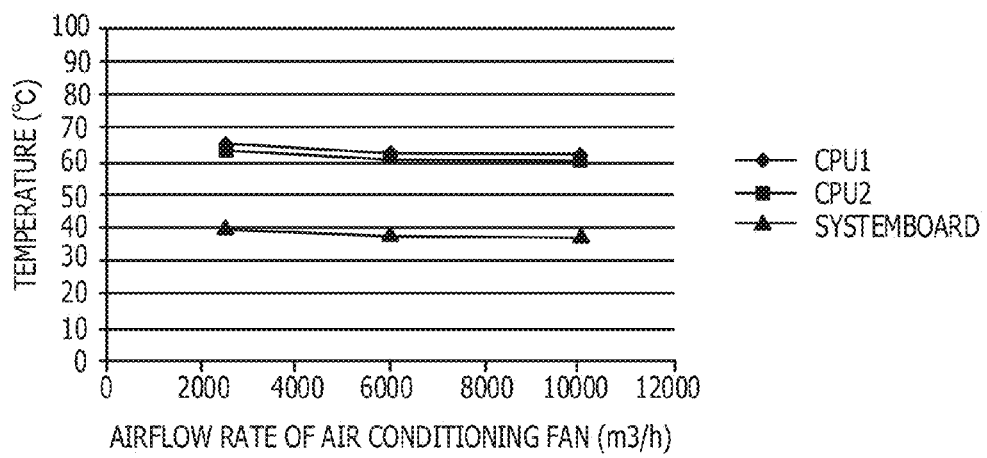

FIG. 7A, FIG. 7B, and FIG. 7C are graphs illustrating relations between the airflow rate of the air conditioning fan 44B and the temperatures of components in the server 50. FIG. 7A illustrates a case where the server built-in fan 54 is driven at a duty ratio of 40%. FIG. 7B illustrates a case where the server built-in fan 54 is driven at a duty ratio of 60%. FIG. 7C illustrates a case where the server built-in fan 54 is driven at a duty ratio of 80%. The measured temperatures of the components include the temperatures of the two CPUs 52, and the temperature of a system board.

As illustrated in FIG. 7A, FIG. 7B, and FIG. 7C, it is understood that the CPU temperatures and the temperature of the system board is lowered as the airflow rate of the air conditioning fan 44B increases. It is understood that the temperature lowering width becomes larger as the duty ratio of the server built-in fan 54 is smaller (as the rotational speed is lower).

Figure 8A:
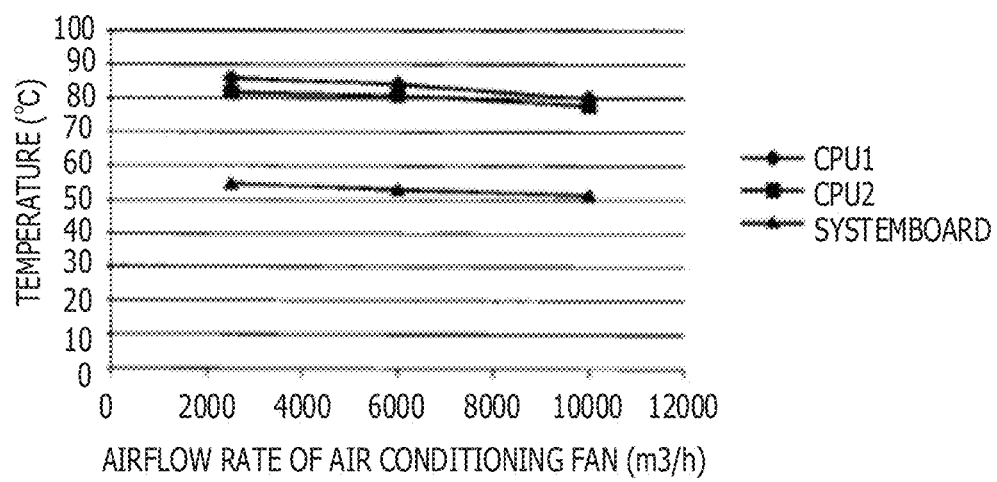
FIG. 8A and FIG. 8B are graphs illustrating relations between the airflow rate of the air conditioning fan and the temperatures of the components in the server (part 2)
Figure 8B:
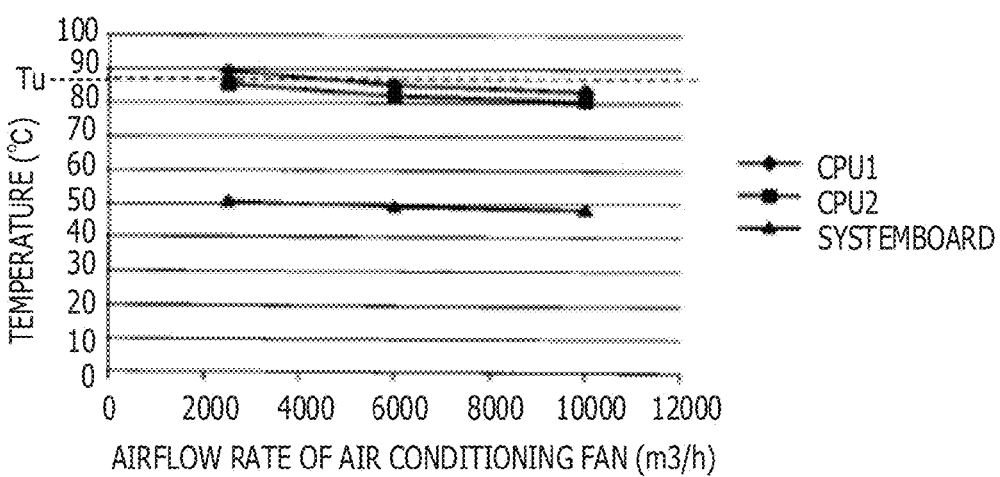

FIG. 8A and FIG. 8B are graphs illustrating relations between the airflow rate of the air conditioning fan 44B and the temperatures of components in the server 50. FIG. 8A illustrates a case where the environment temperature is 25° C. FIG. 8B illustrates a case where the environment temperature is 30° C. FIG. 8A and FIG. 8B illustrate the abovementioned relation when the server built-in fan 54 is driven at a duty ratio of 60%. FIG. 7A, FIG. 7B, and FIG. 7C illustrate data when the environment temperature is 18° C. The environment temperature in the data of FIG. 7B is different from that in the data of FIG. 8A and FIG. 8B.

As illustrated in FIG. 8A and FIG. 8B, it is understood that even when the server built-in fan 54 is driven at a duty ratio of 60% that is not more than 100%, the airflow rate of the air conditioning fan 44B increases to allow the CPU temperature to be suppressed less than an allowable upper limit value $T_u$ of the CPU temperature.

Figure 9:
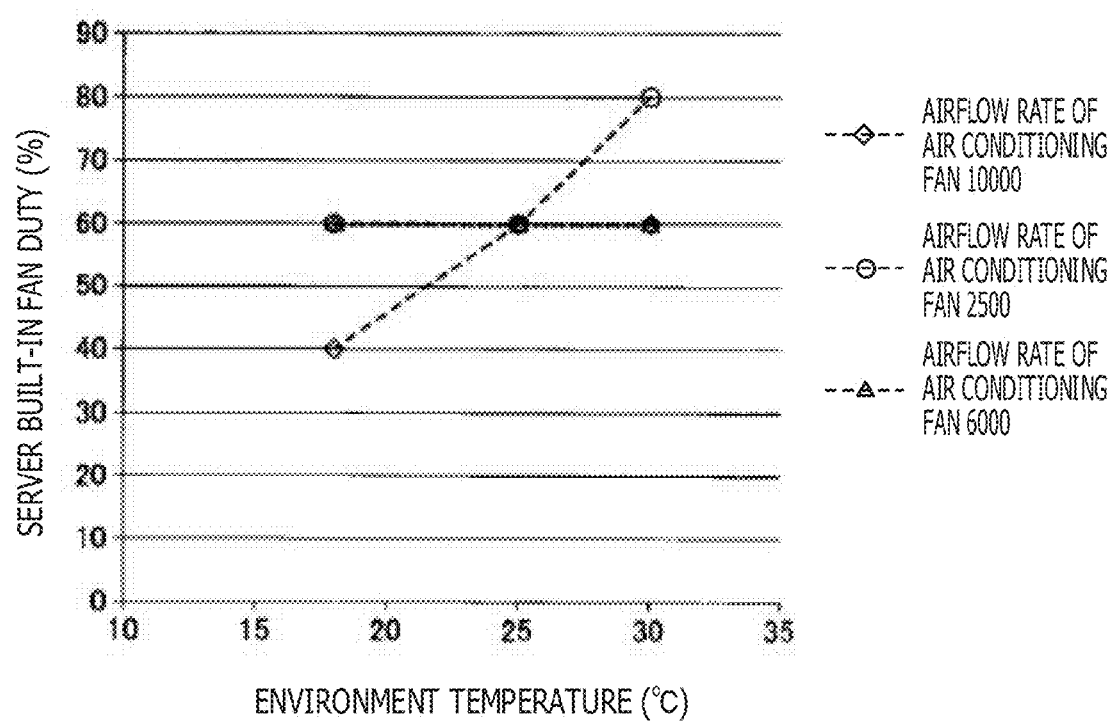
FIG. 9 is a graph illustrating a relation between the environment temperature and a duty ratio of a server built-in fan.

FIG. 9 is a graph illustrating a relation between the environment temperature and the duty ratio of the server built-in fan 54. FIG. 9 illustrates three cases where the airflow rate of the air conditioning fan 44B is 2500 m³/h, where 6000 m³/h, and where 10000 m³/h. FIG. 9 illustrates the abovementioned relation when the CPU temperature becomes not more than the allowable upper limit value $T_u$ (in this case, 89° C.) with 100% of the load factor of the CPU 52.

As illustrated in FIG. 9, for example, at the environment temperature of 18° C., in the cases where the airflow rate of the air conditioning fan 44B is 2500 m³/h and 6000 m³/h, the duty ratio of the server built-in fan 54 becomes approximately 60%. On the other hand, at the environment temperature of 18° C., in the case where the airflow rate of the air conditioning fan 44B is 10000 m³/h, the duty ratio of the server built-in fan 54 becomes approximately 40%. Accordingly, it is understood that the airflow rate of the air conditioning fan 44B is increased to allow the duty ratio of the server built-in fan 54 to be reduced while the CPU temperature is maintained at not more than the allowable upper limit value $T_u$.

Similarly, for example, at the environment temperature of 30° C., in the case where the airflow rate of the air conditioning fan 44B is 2500 m³/h, the duty ratio of the server built-in fan 54 becomes approximately 80%. On the other hand, at the environment temperature of 30° C., in the cases where the airflow rate of the air conditioning fan 44B is 10000 m³/h and 6000 m³/h, the duty ratio of the server built-in fan 54 becomes approximately 60%. Accordingly, it is understood that the airflow rate of the air conditioning fan 44B is increased to allow the duty ratio of the server built-in fan 54 to be reduced while the CPU temperature is maintained at not more than the allowable upper limit value $T_u$.

Figure 10:
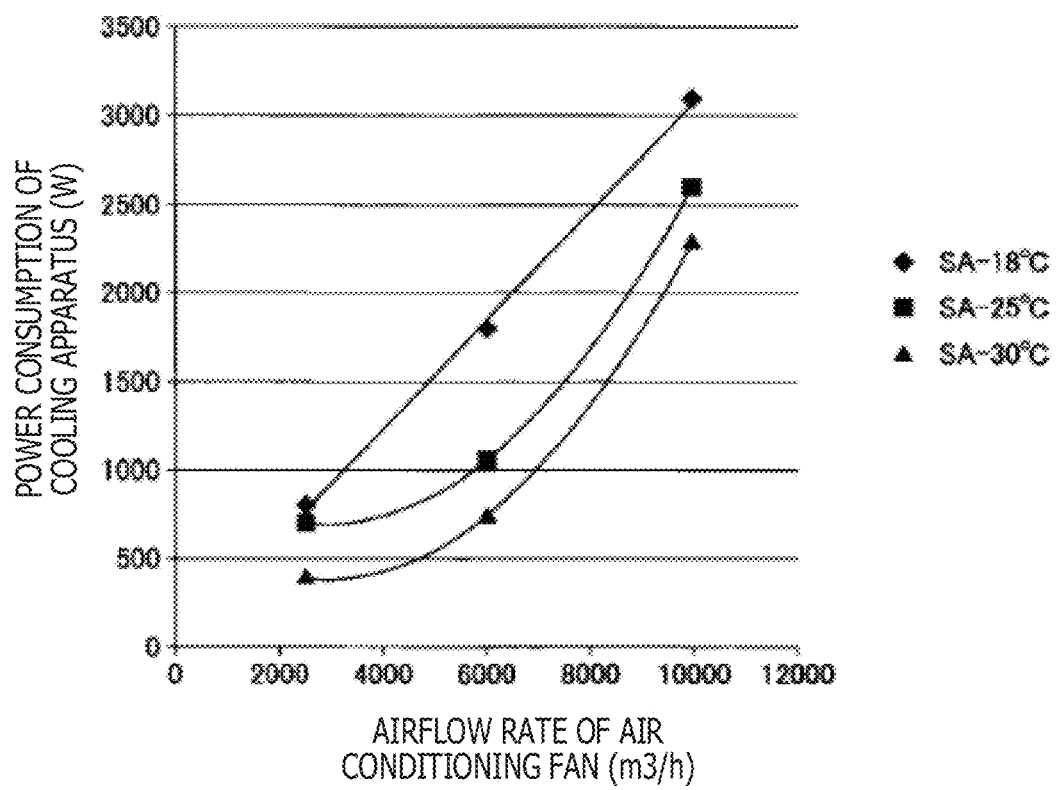
FIG. 10 is a graph illustrating a relation between the airflow rate of the air conditioning fan and air conditioner power consumption.

FIG. 10 is a graph illustrating a relation between the airflow rate of the air conditioning fan 44B and the power consumption of the cooling apparatus 40B (air conditioner power consumption). FIG. 10 illustrates three cases where the environment temperature is 18° C., where the environment temperature is 25° C., and where the environment temperature is 30° C.

As illustrated in FIG. 10, it is understood that the air conditioner power consumption increases as the airflow rate of the air conditioning fan 44B increases. In the example illustrated in FIG. 10, a difference between the maximum power consumption and the minimum power consumption is approximately 2 kW.

As illustrated in FIG. 7A, FIG. 7B, FIG. 7C, FIG. 8A, FIG. 8B, FIG. 9, and FIG. 10, the airflow rate of the air conditioning fan 44B is increased to allow the duty ratio of the server built-in fan 54 to be reduced while the CPU temperature is maintained at not more than the allowable upper limit value $T_u$. This means that the airflow rate of the air conditioning fan 44B is increased to allow the duty ratio of the server built-in fan 54 to be reduced while the CPU temperature is maintained at the target CPU temperature. At this time, if the total reduced amount of the server power consumption due to increase in the airflow rate of the air conditioning fans 44B is more than the increased amount of the air conditioner power consumption due to increase in the airflow rate of the air conditioning fans 44B, it is possible to reduce the power consumption of the modular-type data center 1A as a whole. Hereinafter, processing executed by the management manager 100 based on such a finding will be explained.

FIG. 11 a flowchart illustrating an example of processing executed by the management manager 100. The processing illustrated in FIG. 11 is started up, for example, when the modular-type data center 1A is started to be operated, and is thereafter repeatedly executed for every predetermined cycle during the operation. The following processing is collectively executed with respect to the multiple cooling apparatuses 40B in the modular-type data center 1A. In other words, it is assumed that the multiple cooling apparatuses 40B are controlled so as to achieve the same airflow rate among the air conditioning fans 44B in the cooling apparatuses 40B.

At S1100, the management manager 100 sets a predetermined initial value as a control target value (for example, the target airflow rate) of the cooling apparatuses 40B in the modular-type data center 1A. Herein, the predetermined initial value is the minimum airflow rate when the power consumption of the air conditioning fan 44B becomes approximate minimum. For example, as illustrated in FIG. 10, when the environment temperature is 30° C., for example, up to an approximate 4000 m³/h of the airflow rate of the air conditioning fan 44B, the power consumption of the air conditioning fan 44B is an approximate minimum value. Accordingly, in this case, the predetermined initial value is set to 4000 m³/h. As is also clear from FIG. 10, the predetermined initial value may be varied depending on the environment temperature. Alternatively, simply, the predetermined initial value may be a fixed value such as 2500 m³/h.

At S1102, the management manager 100 acquires air conditioner power consumption information from each of the cooling apparatuses 40B in the modular-type data center 1A.

At S1104, the management manager 100 acquires server power consumption information from each of the servers 50 in the modular-type data center 1A.

At S1106, the management manager 100 calculates, based on the information acquired at S1102 and the information acquired at S1104, current power consumption of the modular-type data center 1A. The power consumption of the modular-type data center 1A may be calculated as a total of the air conditioner power consumption and the server power consumption.

At S1108, the management manager 100 increases the control target value of the cooling apparatuses 40B in the modular-type data center 1A by a predetermined amount $\Delta V$. With the smaller the predetermined amount $\Delta V$, it is possible to obtain an optimum value (a control target value of the cooling apparatuses 40B at which the power consumption of the modular-type data center 1A is a minimal value) with higher accuracy, however, a processing load increases. Accordingly, the predetermined amount $\Delta V$ may be determined as appropriate based on the relation between the accuracy to be desired and the processing load. The predetermined amount $\Delta V$ may be, for example, 500 m³/h. The control target value changed in this manner is transmitted to the cooling apparatuses 40B. In response to this, the air conditioning controllers 46 in the cooling apparatuses 40B control the corresponding air conditioning fans 44B so as to implement the changed control target value. This control mode may be flexibly determined, for example, a feedback control and the like similar to that employed in the server built-in fan 54 may be employed.

Herein, when the process at S1108 is executed, the airflow rate of the air conditioning fan 44B in each of the cooling apparatuses 40B increases. Accordingly, the duty ratio of each of the server built-in fans 54 in the modular-type data center 1A tends to be reduced. In other words, as illustrated in FIG. 7A, FIG. 7B, FIG. 7C, and the like, when the airflow rate of the air conditioning fan 44B in the cooling apparatus 40B increases, the CPU temperature tends to be lowered. Accordingly, the airflow rate of each of the server built-in fans 54 tends to decrease by the amount corresponding to the lowered CPU temperature. Such reduction in the airflow rate of each of the server built-in fans 54 is implemented by the processing illustrated in FIG. 5. In other words, the server built-in fans 54 are feedback-controlled such that the CPU temperature becomes the target CPU temperature. Accordingly, when the CPU temperature tends to be lowered due to increase in the airflow rate of the air conditioning fans 44B, the airflow rate of each of the server built-in fans 54 also tends to decrease. Actually, even when the airflow rate of the air conditioning fans 44B in the cooling apparatuses 40B increases, the duty ratio of each of the server built-in fans 54 in the modular-type data center 1A may not be reduced in some cases. This is because, for example, when the environment temperature and/or the load factor are high, and the airflow rate of the air conditioning fans 44B is increased, the CPU temperature may not be significantly lowered in some cases.

At S1110, the management manager 100 acquires air conditioner power consumption information after the airflow rate of the air conditioning fan 44B increases at S1108 described above from each of the cooling apparatuses 40B in the modular-type data center 1A.

At S1112, the management manager 100 acquires server power consumption information after the airflow rate of the air conditioning fan 44B increases at S1108 described above from each of the servers 50 in the modular-type data center 1A.

At S1114, the management manager 100 calculates, based on the air conditioner power consumption information (a difference between a current value and a previous value) acquired at S1110 described above, an increased amount $\Delta Wf2$ of air conditioner power consumption due to increase in the airflow rate of the air conditioning fan 44B at S1108 described above. Only the increased amount $\Delta Wf2$ corresponding to one specific cooling apparatus 40B may be calculated by assuming that the increased amounts $\Delta Wf2$ are identical among the cooling apparatuses 40B. In this case, the air conditioner power consumption information may be acquired from the one specific cooling apparatus 40B.

At S1116, the management manager 100 calculates, based on the server power consumption information (a difference between a current value and a previous value) acquired at S1112 described above, a decreased amount $\Delta Wf1$ of server power consumption due to increase in the airflow rate of the air conditioning fan 44B at S1108 described above. The decreased amount $\Delta Wf1$ is preferably calculated for each of the servers 50.

At S1118, the management manager 100 determines whether a total (=$\Delta Wf1_{total}$) of the decreased amounts $\Delta Wf1$ of server power consumption in all the servers 50 is more than a total (=$\Delta Wf2_{total}$) of the increased amounts $\Delta Wf2$ of air conditioner power consumption in all the cooling apparatuses 40B. If the $\Delta Wf1_{total}$ is more than the $\Delta Wf2_{total}$, the processing returns to S1108, and the processes from S1108 are repeated. On the other hand, if the $\Delta Wf1_{total}$ is not more than the $\Delta Wf2_{total}$, the processing proceeds to S1120.

In this manner, the airflow rate of the air conditioning fan 44B is increased by the predetermined amount $\Delta V$ before the $\Delta Wf1_{total}$ becomes not more than the $\Delta Wf2_{total}$. The $\Delta Wf1_{total}$ more than the $\Delta Wf2_{total}$ means that the power consumption in the modular-type data center 1A is reduced due to increase in the airflow rate of the air conditioning fans 44B. Therefore, while the airflow rate of the air conditioning fans 44B is increased by the predetermined amount $\Delta V$, an optimum value (optimum value of the airflow rate of the air conditioning fans 44B) when the power consumption in the modular-type data center 1A is at a minimal value is searched.

At S1120, the management manager 100 decreases the control target value of each of the cooling apparatuses 40B in the modular-type data center 1A by the predetermined amount $\Delta V$. In other words, the management manager 100 cancels the abovementioned processing at S1108. This is because the $\Delta Wf1_{total}$ not more than the $\Delta Wf2_{total}$ means that the airflow rate of the air conditioning fans 44B before being increased was the minimal value of power consumption in the modular-type data center 1A. This allows the modular-type data center 1A to be returned in a state where the power consumption therein is at the minimal value.

At S1122, the management manager 100 determines whether the number of the servers operating in the modular-type data center 1A is changed. The number of the operating servers may be the number of the servers 50 operating at a predetermined load factor or more. This is because when the number of the operating servers is changed, the airflow rate of the air conditioning fan 44B when the power consumption in the modular-type data center 1A is at the minimal value may be changed. When the number of the servers operating in the modular-type data center 1A is changed, the processing returns to S1100, again searches for an optimum value, and performs the processes from S1100. On the other hand, when the number of the operating servers is not changed, the management manager 100 does not change the airflow rate of the air conditioning fan 44B, and maintains the current state.

With the processing illustrated in FIG. 11, it is possible to obtain the control target value with which the power consumption in the modular-type data center 1A is at the minimal value while increasing the control target value of the air conditioning fan 44B in each of the cooling apparatuses 40B. This allows the airflow rate of the air conditioning fan 44B in each of the cooling apparatuses 40B to be set such that the power consumption in the modular-type data center 1A is at the minimal value. As a result, it is possible to reduce the power consumption in the modular-type data center 1A while maintaining the CPU temperature to the suitable temperature (in this example, the target CPU temperature).

The processing illustrated in FIG. 11 is executed, as a precondition, under a situation in which the CPU temperature is normally controlled so as to be the target CPU temperature or less with the processing illustrated in FIG. 5. Therefore, for example, when the CPU temperature significantly exceeds the target CPU temperature in a state where the duty ratio of each of the server built-in fans 54 is set to 100%, the processing illustrated in FIG. 11 may be suspended. In other words, when the CPU temperature significantly exceeds the target CPU temperature even if the duty ratio of each of the server built-in fans 54 is set to 100%, the fan controllers 56 in the servers 50 may request the management manager 100 to increase the airflow rate of the air conditioning fans 44B. In this case, the management manager 100 may suspend the processing illustrated in FIG. 11, and immediately increase the control target value for the air conditioning fan 44B in each of the cooling apparatuses 40B. Alternatively, the processing illustrated in FIG. 11 may be suspended, in the state where the duty ratio of each of the server built-in fans 54 is set to 100%, when the CPU temperature has a predetermined margin or less with respect to the allowable upper limit value $T_u$ (see FIG. 8B). In other words, even in the state where the duty ratio of each of the server built-in fans 54 is set to 100%, when the CPU temperature has a predetermined margin or less with respect to the allowable upper limit value $T_u$, the fan controller 56 may request the management manager 100 to increase the airflow rate of the air conditioning fan 44B. In this case, similarly, the management manager 100 may suspend the processing illustrated in FIG. 11, and immediately increase the control target value for the air conditioning fan 44B in each of the cooling apparatuses 40B.

In the example illustrated in FIG. 11, in the process at S1118, as described above, the management manager 100 compares the total of the decreased amounts $\Delta Wf1$ of server power consumption after the airflow rate of the air conditioning fans 44B is increased with the total of the increased amounts $\Delta Wf2$ of air conditioner power consumption after the airflow rate of the air conditioning fans 44B is increased. However, in the process at S1118, the management manager 100 may compare the power consumption in the modular-type data center 1A before the airflow rate of the air conditioning fan 44B is increased with the power consumption in the modular-type data center 1A after the airflow rate of the air conditioning fans 44B is increased, in an equivalent manner. In this case, if the power consumption in the modular-type data center 1A after the airflow rate of the air conditioning fans 44B is increased is smaller than the power consumption before the airflow rate thereof is increased, the processing returns to the process at S1108, and in the other cases, the processing may proceed to S1120.

In the example illustrated in FIG. 11, at S1122, as described above, the management manager 100 determines whether the number of the operating servers is changed. Further, if the number of the operating servers is changed, the processing returns to S1100. However, the processing may return to S1100 under another condition. For example, when a predetermined period of time (for example, five minutes) is elapsed after the process at S1120 is performed, the processing may return to S1100. Alternatively, after the process at S1120, when another change (for example, significant change in the environment temperature or the like) that causes the optimum value when the power consumption in the modular-type data center 1A is at the minimal value to be varied occurs, the processing may return to S1100.

The processing illustrated in FIG. 11 is preferable especially when the number of the operating servers 50 is large. This is because the total ($=\Delta Wf1_{total}$) of the decreased amounts $\Delta Wf1$ of server power consumption in all the servers 50 when the airflow rate of the cooling apparatuses 40B is increased tends to become larger as the number of the operating servers 50 becomes larger. Therefore, the processing illustrated in FIG. 11 may be executed when the number of the operating servers is a predetermined number or more.

FIG. 12 is a flowchart illustrating another example of processing executed by the management manager 100. The processing illustrated in FIG. 12 is started up, for example, when the modular-type data center 1A is started to be operated, and is thereafter repeatedly executed for every predetermined cycle during the operation. The following processing is collectively executed with respect to the multiple cooling apparatuses 40B in the modular-type data center 1A. In other words, it is assumed that the multiple cooling apparatuses 40B are controlled so as to achieve the same airflow rate among the air conditioning fans 44B in the cooling apparatuses 40B.

The processing illustrated in FIG. 12 is different from the processing illustrated in FIG. 11 in the following point. In the example illustrated in FIG. 11, the predetermined initial value at S1100 corresponds to the minimum airflow rate of the air conditioning fan 44B. Further, the management manager 100 searches the optimum value when the power consumption in the modular-type data center 1A is at the minimal value while gradually increasing the airflow rate of the air conditioning fans 44B. In contrast, in the processing illustrated in FIG. 12, the predetermined initial value corresponds to the maximum airflow rate of the air conditioning fan 44B. Further, the management manager 100 searches the optimum value when the power consumption in the modular-type data center 1A is at the minimal value while gradually decreasing the airflow rate of the air conditioning fans 44B.

In the processing illustrated in FIG. 12, the processes from S1202 to S1206 are respectively the same as those from S1102 to S1106 illustrated in FIG. 11. In the processing illustrated in FIG. 12, the processes at S1210, S1212, and S1222 are respectively the same as those at S1110, S1112, and S1122 illustrated in FIG. 11. Hereinafter, the configuration specific to the processing illustrated in FIG. 12 will be explained.

At S1200, the management manager 100 sets a predetermined initial value as a control target value (for example, the target airflow rate) of the cooling apparatuses 40B in the modular-type data center 1A. Herein, the predetermined initial value is the maximum airflow rate of the air conditioning fan 44B. For example, the predetermined initial value is set to 10000 m³/h.

At S1208, the management manager 100 decreases the control target value of the cooling apparatuses 40B in the modular-type data center 1A by a predetermined amount $\Delta V$. The predetermined amount $\Delta V$ may be, for example, 500 m³/h. The control target value changed in this manner is transmitted to the cooling apparatuses 40B. In response to this, the air conditioning controllers 46 in the cooling apparatuses 40B control the corresponding air conditioning fans 44B so as to implement the changed control target value.

Herein, when the process at S1208 is executed, the airflow rate of the air conditioning fan 44B in each of the cooling apparatuses 40B decreases. Accordingly, the duty ratio of each of the server built-in fans 54 in the modular-type data center 1A tends to be increased. In other words, as illustrated in FIG. 7A, FIG. 7B, FIG. 7C, and the like, when the airflow rate of the air conditioning fan 44B in the cooling apparatus 40B decreases, the CPU temperature tends to be raised, so that the airflow rate of each of the server built-in fans 54 tends to increase by the amount corresponding to the raised CPU temperature. Such increase in the airflow rate of each of the server built-in fans 54 is implemented by the processing illustrated in FIG. 5. In other words, the server built-in fans 54 are feedback-controlled such that the CPU temperature becomes the target CPU temperature. Accordingly, when the CPU temperature tends to be raised due to decrease in the airflow rate of the air conditioning fans 44B, the airflow rate of each of the server built-in fans 54 also tends to increase. Actually, even when the airflow rate of the air conditioning fans 44B in the cooling apparatuses 40B decreases, the duty ratio of each of the server built-in fans 54 in the modular-type data center 1A may not be increased in some cases. This is because, for example, when the environment temperature and/or the load factor are low, and the airflow rate of the air conditioning fans 44B is decreased, the CPU temperature may not be significantly raised in some cases.

At S1214, the management manager 100 calculates, based on the air conditioner power consumption information (a difference between a current value and a previous value) acquired at S1210 described above, a decreased amount $\Delta Wf4$ of air conditioner power consumption due to decrease in the airflow rate of the air conditioning fan 44B at S1208 described above. Only the decreased amount $\Delta Wf4$ corresponding to one specific cooling apparatus 40B may be calculated by assuming that the decreased amounts $\Delta Wf4$ are identical among all the cooling apparatuses 40B. In this case, the air conditioner power consumption information may be acquired from the one specific cooling apparatus 40B.

At S1216, the management manager 100 calculates, based on the server power consumption information (a difference between a current value and a previous value) acquired at S1212 described above, an increased amount $\Delta Wf3$ of server power consumption due to decrease in the airflow rate of the air conditioning fan 44B at S1208 described above. The increased amount $\Delta Wf3$ is preferably calculated for each of the servers 50.

At S1218, the management manager 100 determines whether a total ($=\Delta Wf4_{total}$) of the decreased amounts $\Delta Wf4$ of server power consumption in all the servers 50 is more than a total ($=\Delta Wf3_{total}$) the increased amounts of $\Delta Wf3$ of air conditioner power consumption in all the cooling apparatuses 40B. If the $\Delta Wf4_{total}$ is more than the $\Delta Wf3_{total}$, the processing returns to S1208, and the processes from S1208 are repeated. On the other hand, if the $\Delta Wf4_{total}$ is not more than $\Delta Wf3_{total}$, the processing proceeds to S1220.

In this manner, the airflow rate of the air conditioning fan 44B is decreased by the predetermined amount $\Delta V$ before the $\Delta Wf4_{total}$ becomes not more than the $\Delta Wf3_{total}$. The $\Delta Wf4_{total}$ more than the $\Delta Wf3_{total}$ means that the power consumption in the modular-type data center 1A is reduced due to decrease in the airflow rate of the air conditioning fans 44B. Therefore, while the airflow rate of the air conditioning fans 44B is decreased by the predetermined amount $\Delta V$, an optimum value (optimum value of the airflow rate of the air conditioning fans 44B) when the power consumption in the modular-type data center 1A is at a minimal value is searched.

At S1220, the management manager 100 increases the control target value of each of the cooling apparatuses 40B in the modular-type data center 1A by the predetermined amount $\Delta V$. In other words, the management manager 100 cancels the abovementioned processing at S1208. This is because the $\Delta Wf4_{total}$ not more than the $\Delta Wf3_{total}$ means that the airflow rate of the air conditioning fans 44B before being decreased was the minimal value of power consumption in the modular-type data center 1A. This allows the modular-type data center 1A to be returned in a state where the power consumption therein is at the minimal value.

With the processing illustrated in FIG. 12, an effect substantially similar to that with the processing illustrated in FIG. 11 may be obtained. In other words, with the processing illustrated in FIG. 12, it is possible to obtain the control target value with which the power consumption in the modular-type data center 1A is at the minimal value while decreasing the control target value of the air conditioning fan 44B in each of the cooling apparatuses 40B. This allows the airflow rate of the air conditioning fan 44B in each of the cooling apparatuses 40B to be set such that the power consumption in the modular-type data center 1A is at the minimal value. As a result, it is possible to reduce the power consumption in the modular-type data center 1A while maintaining the CPU temperature to the suitable temperature (in this example, the target CPU temperature).

The concept of the processing illustrated in FIG. 12 may be combined with the concept of the processing illustrated in FIG. 11. For example, if the affirmative determination is made at S1222, the processing does not return to S1200 but may return to S1208. As a result, if the affirmative determination is made at S1218, the processing returns to S1208, whereas if the negative determination is made at S1218, the processing may proceed to S1108 in FIG. 11, and perform the processes from S1108.

Although the embodiments have been described in detail, the present disclosure is not limited thereto but the various modifications and changes could be made hereto without departing from the spirit and scope of the disclosure. It is also possible to combine all of or a plurality of the constituent components in the embodiments described above.

For example, in the embodiments described above, the server built-in fan 54 is controlled such that the CPU temperature becomes the target CPU temperature. However, the server built-in fan 54 may be controlled such that the temperature at another portion in the server 50 becomes a predetermined target temperature.

In the embodiments described above, the air conditioning fans 44B of the cooling apparatuses 40B are collectively controlled by the common control target value. However, the air conditioning fans 44B of the cooling apparatuses 40B may be independently controlled by specific control target values. In this case, in the processing in FIG. 11, the management manager 100 may set specific control target values at S1100, S1108, and the like.

In the embodiments described above, a control method of the cooler 42B in each of the cooling apparatuses 40B may be flexibly determined. For example, the cooler 42B may be controlled based on the environment temperature and the like.

In the embodiments described above, a part of or all parts of the function of the management manager 100 may be implemented by another controller (for example, the air conditioning controller 46 or the fan controller 56). A part of or all parts of the another controller (for example, the air conditioning controller 46 or the fan controller 56) may be implemented by the management manager 100.

In the embodiments described above, each of the racks 30 houses therein the servers 50. However, the racks 30 may house therein other information processing apparatus.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A control method of a system including a plurality of computers each of which provides a first cooling apparatus, and a second cooling apparatus that cools the plurality of computers by supplying air thereto, the control method comprising:
    supplying, by the second cooling apparatus, air at a first airflow rate to the plurality of computers;
    acquiring first information on power consumption of the plurality of first cooling apparatuses in the plurality of computers and power consumption of the second cooling apparatus under the supply of the air at the first airflow rate;
    supplying, by the second cooling apparatus, air at a second airflow rate to the plurality of computers after the first information is acquired, the second airflow rate having a value obtained by changing the first airflow rate by a predetermined amount;
    acquiring second information on the power consumption of the plurality of first cooling apparatuses in the plurality of computers and the power consumption of the second cooling apparatus under the supply of the air at the second airflow rate; and
    changing the airflow rate of the second cooling apparatus by the predetermined amount, based on a comparison result between a changed amount of the power consumption of the plurality of first cooling apparatuses in the plurality of computers and a changed amount in the power consumption of the second cooling apparatus under the condition that the airflow rate is changed from the first airflow rate to the second airflow rate.

2. The control method according to claim 1, wherein
    the supplying the air at the second airflow rate includes increasing a value of the first airflow rate by the predetermined amount, and
    the changing includes:

increasing the airflow rate of the second cooling apparatus by the predetermined amount when it is determined that a decreased amount of the power consumption of the plurality of first cooling apparatuses is more than an increased amount of the power consumption in the second cooling apparatus under the condition that the airflow rate is changed from the first airflow rate to the second airflow rate; and decreasing the airflow rate of the second cooling apparatus by the predetermined amount when it is not determined that the decreased amount of the power consumption of the plurality of first cooling apparatuses is more than the increased amount of the power consumption in the second cooling apparatus under the condition that the airflow rate is changed from the first airflow rate to the second airflow rate.

3. The control method according to claim 2, wherein the increasing the airflow rate of the second cooling apparatus by the predetermined amount includes:

updating the second airflow rate by increasing the airflow rate of the second cooling apparatus by the predetermined amount; and processing to increase the airflow rate by the predetermined amount is repeated using the updated second airflow rate until it is no longer determined that the decreased amount of the power consumption of the plurality of first cooling apparatuses is more than the increased amount of the power consumption in the second cooling apparatus.

4. The control method according to claim 1, wherein the supplying the air at the second airflow rate includes increasing a value of the first airflow rate by the predetermined amount, and the changing the airflow rate of the second cooling apparatus by the predetermined amount includes:

decreasing the airflow rate of the second cooling apparatus by the predetermined amount when it is determined that a decreased amount of the power consumption of the plurality of first cooling apparatuses is more than an increased amount of the power consumption in the second cooling apparatus under the condition that the airflow rate is changed from the first airflow rate to the second airflow rate; and increasing the airflow rate of the second cooling apparatus by the predetermined amount when it is not determined that the decreased amount of the power consumption of the plurality of first cooling apparatuses is more than the increased amount of the power consumption in the second cooling apparatus under the condition that the airflow rate is changed from the first airflow rate to the second airflow rate.

5. The control method according to claim 4, wherein the decreasing the airflow rate of the second cooling apparatus by the predetermined amount includes:

updating the second airflow rate by decreasing the airflow rate of the second cooling apparatus by the predetermined amount; and processing to decrease the airflow rate by the predetermined amount is repeated using the updated second airflow rate until it is no longer determined that the decreased amount of the power consumption of the plurality of first cooling apparatuses is more than the increased amount of the power consumption in the second cooling apparatus.

6. The control method according to claim 1, wherein the changing the airflow rate of the second cooling apparatus by the predetermined amount includes comparing a total of changed amounts of the power consumption of the plurality of first cooling apparatuses with a changed amount of the power consumption in the second cooling apparatus.

7. The control method according to claim 1, further comprising:

determining whether the number of computers operating among the plurality of computers is a predetermined number or more, wherein the acquiring the first information includes setting the first airflow rate and acquiring the first information when the number of operating computers is the predetermined number or more.

8. The control method according to claim 7, further comprising:

determining whether the number of operating computers is changed, wherein the setting the first airflow rate includes setting the first airflow rate when it is determined that the number of operating computers is changed.

9. A system comprising:

a plurality of computers each of which provides a first cooling apparatus;

a second cooling apparatus configured to cool the plurality of computers by supplying air thereto; and a computer coupled to the second cooling apparatus, wherein the computer includes:

a memory; and a processor coupled to the memory and configured to:

cause the second cooling apparatus to supply air at a first airflow rate to the plurality of computers;

acquire first information on power consumption of the plurality of first cooling apparatuses in the plurality of computers and power consumption of the second cooling apparatus, when the second cooling apparatus supplies the air at the first airflow rate;

cause the second cooling apparatus to supply air at a second airflow rate to the plurality of computers after the first information is acquired, the second airflow rate being a value obtained by changing the first airflow rate by a predetermined amount;

acquire second information on power consumption of the plurality of first cooling apparatuses in the plurality of computers and power consumption of the second cooling apparatus, when the second cooling apparatus supplies the air at the second airflow rate; and change the airflow rate of the second cooling apparatus by the predetermined amount, based on a comparison result between changed amount of the power consumption of the plurality of first cooling apparatuses in the plurality of computers and a changed amount of the power consumption in the second cooling apparatus caused due to the change of the airflow rate from the first airflow rate to the second airflow rate.

10. The system according to claim 9, wherein the processor is configured to:

cause the second cooling apparatus to supply the supplying the air at the second airflow rate by increasing a value of the first airflow rate by the predetermined amount;

increase the airflow rate of the second cooling apparatus by the predetermined amount when it is determined that a decreased amount of the power consumption of the plurality of first cooling apparatuses is more than an increased amount of the power consumption in the second cooling apparatus under the condition that the airflow rate is changed from the first airflow rate to the second airflow rate; and decrease the airflow rate of the second cooling apparatus by the predetermined amount when it is not determined that the decreased amount of the power consumption of the plurality of first cooling apparatuses is more than the increased amount of the power consumption in the second cooling apparatus under the condition that the airflow rate is changed from the first airflow rate to the second airflow rate.

11. The system according to claim 10, wherein the processor is configured to:

update the second airflow rate by increasing the airflow rate of the second cooling apparatus by the predetermined amount; and repeat processing to increase the airflow rate by the predetermined amount using the updated second airflow rate until it is no longer determined that the decreased amount of the power consumption of the plurality of first cooling apparatuses is more than the increased amount of the power consumption in the second cooling apparatus.

12. The system according to claim 10, wherein the processor is configured to:

supply the air at the second airflow rate by increasing a value of the first airflow rate by the predetermined amount;

decrease the airflow rate of the second cooling apparatus by the predetermined amount when it is determined that a decreased amount of the power consumption of the plurality of first cooling apparatuses in the plurality of computers is more than an increased amount of the power consumption in the second cooling apparatus under the condition that the airflow rate is changed from the first airflow rate to the second airflow rate; and increase the airflow rate of the cooling apparatus by the predetermined amount when it is not determined that the decreased amount of the power consumption of the plurality of first cooling apparatuses in the plurality of computers is more than the increased amount of the power consumption in the second cooling apparatus under the condition that the airflow rate is changed from the first airflow rate to the second airflow rate.

13. The system according to claim 12, wherein the processor is configured to:

update the second airflow rate by decreasing the airflow rate of the second cooling apparatus by the predetermined amount; and repeat processing to decrease the airflow rate by the predetermined amount is repeated using the updated second airflow rate until it is no longer determined that the decreased amount of the power consumption of the plurality of first cooling apparatuses in the plurality of computers is more than the increased amount of the power consumption in the second cooling apparatus.

14. A non-transitory computer-readable storage medium storing a program that causes a computer to execute a process, the process comprising:

acquiring first information on power consumption of a plurality of first cooling apparatuses in a plurality of computers and power consumption of a second cooling apparatus under a condition that the second cooling apparatus supplies air at a first airflow rate to the plurality of computers;

causing the second cooling apparatus to supply air at a second airflow rate to the plurality of computers after the first information is acquired, the second airflow rate being a value obtained by changing the first airflow rate by a predetermined amount;

acquiring second information on power consumption of the plurality of first cooling apparatuses in the plurality of computers and power consumption of the second cooling apparatus under a condition that the second cooling apparatus supplies the air at the second airflow rate; and changing the airflow rate of the second cooling apparatus by the predetermined amount, based on a comparison result between a changed amount of the power consumption of the plurality of first cooling apparatuses in the plurality of computers and a changed amount of the power consumption in the second cooling apparatus caused due to the change of the airflow rate from the first airflow rate to the second airflow rate.

* * * * *